(12) United States Patent
Reinmuth et al.

(10) Patent No.: US 11,897,756 B2
(45) Date of Patent: Feb. 13, 2024

(54) MICROMECHANICAL DEVICE WITH CONTACT PAD

(71) Applicant: Robert Bosch GmbH, Stuttgart (DE)

(72) Inventors: Jochen Reinmuth, Reutlingen (DE); Martin Rambach, Pliezhausen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/735,675

(22) Filed: May 3, 2022

(65) Prior Publication Data
US 2022/0363532 A1    Nov. 17, 2022

(30) Foreign Application Priority Data
May 17, 2021    (DE) ..................... 10 2021 204 950.8

(51) Int. Cl.
*B81B 3/00*    (2006.01)

(52) U.S. Cl.
CPC ........ *B81B 3/001* (2013.01); *B81B 2203/033* (2013.01); *B81B 2207/097* (2013.01)

(58) Field of Classification Search
CPC ... B81B 3/001; B81B 2207/097; B81B 7/007; B81B 2207/012; B81B 7/0032; B81B 7/02; B81C 99/004
See application file for complete search history.

(56) References Cited

U.S. PATENT DOCUMENTS

| 2012/0280594 A1* | 11/2012 | Chen | H10N 30/88 310/313 R |
| 2016/0130137 A1* | 5/2016 | Huang | B81C 1/00285 438/51 |
| 2018/0149538 A1* | 5/2018 | Gritti | G01L 19/0092 |

FOREIGN PATENT DOCUMENTS

| DE | 102012206732 A1 | 10/2013 |
| DE | 112014004867 B4 | 12/2021 |

* cited by examiner

*Primary Examiner* — Samuel A Gebremariam
(74) *Attorney, Agent, or Firm* — NORTON ROSE FULBRIGHT US LLP; Gerard A. Messina

(57) ABSTRACT

A micromechanical device that includes a MEMS substrate and a cap substrate that enclose at least one first cavity, with at least one contact pad that is situated outside the first cavity. A MEMS structure is situated in the first cavity and connected to the contact pad with the aid of a strip conductor, the strip conductor extending at least partially in the MEMS substrate. The contact pad is situated at a surface of the cap substrate.

7 Claims, 7 Drawing Sheets

MICROMECHANICAL DEVICE WITH CONTACT PAD

CROSS REFERENCE

The present application claims the benefit under 35 U.S.C. § 119 of German Patent Application No. 10 2021 204 950.8 filed on May 17, 2021, which is expressly incorporated herein by reference in its entirety.

FIELD

The present invention is directed to a micromechanical device that includes a MEMS substrate and a cap substrate that enclose at least one first cavity, with at least one contact pad that is situated outside the first cavity, a MEMS structure being situated in the first cavity and connected to the contact pad with the aid of a strip conductor, the strip conductor extending at least partially in the MEMS substrate.

BACKGROUND INFORMATION

Microelectromechanical systems (MEMSs) such as MEMS sensors must be protected from the environment in order to function properly. This includes the environmental influences of pressure, moisture, particles, etc.

This is achieved by closing off the MEMS component with a cap. For this purpose, during the manufacturing process a MEMS wafer is bonded to a cap wafer; this may be, for example, eutectic bonding using Al/Ge. To ensure the functioning of the MEMS component and avoid having to further process defective parts and deliver them to the customer, the MEMS component is electrically measured. This requires both suitable measuring pads as well as access to these measuring pads. This is achieved by providing an opening outside the protected area of the MEMS component which allows access to measuring pads on the MEMS substrate.

However, the previous approach is no longer possible if an ASIC is bonded to a MEMS on the wafer level. In this case, the ASIC forms the cap, and the MEMS signal is conducted onto the cap and processed by the ASIC, and the ASIC signal is conducted onto the rear side of the cap. Direct access to the MEMS signals is no longer possible. A characterization of the MEMS signals is possible only indirectly via the respective ASIC. A disadvantage of this arrangement is that poor-quality MEMS components can be identified only after a wafer bonding process; i.e., MEMS wafers in a low yield are refined using a costly ASIC cap wafer, the bonding process, and all further process steps before a decision may be made as to whether this is cost-effective. In addition, the ASIC must include additional circuits in order to check, based on the MEMS signals, whether each individual MEMS element is fully functional. This requires auxiliary functions that must be kept available in each ASIC. Furthermore, the MEMS signals must also be checked by these auxiliary functions of the ASIC. This cannot be carried out as efficiently as a MEMS signal test on the wafer level via pads. For this type of wafer level test, a very expensive and complicated evaluation electronics system is used that is specially developed only for this purpose, and with which each MEMS chip is developed. Due to the continuous use of this electronics system, the costs for the evaluation electronics system play a subordinate role. However, for a test of a MEMS chip using an evaluation circuit in an associated ASIC, which is used only once, the costs of the evaluation circuit play a significant role. In particular, complex testing tasks, necessary for automotive applications, for example, cannot be implemented in a simple ASIC. In addition, the ASIC must be developed well in advance. If new tests for the MEMS signals become necessary during the development phase or the series production phase, this cannot be responded to. A novel implementation both of the access as well as of the arrangement of the measuring pads is therefore necessary, which is discussed in the following description of the present application for the invention.

SUMMARY

The present invention is directed to a micromechanical device that includes a MEMS substrate and a cap substrate that enclose at least one first cavity, with at least one contact pad that is situated outside the first cavity, a MEMS structure being situated in the first cavity and connected to the contact pad with the aid of a strip conductor, the strip conductor extending at least partially in the MEMS substrate. The essence of the present invention is that the contact pad is situated at a surface of the cap substrate.

One advantageous example embodiment of the present invention provides that the contact pad is situated in a second cavity formed by the MEMS substrate and by the cap substrate. It is particularly advantageous when the second cavity has a pad access to the outside via the MEMS substrate.

One advantageous example embodiment of the present invention provides that the strip conductor includes an electrically conductive connection between the MEMS substrate and the cap substrate.

It is also advantageous that the cap substrate includes an integrated electronic circuit, in particular an ASIC.

The present invention allows MEMS structures in general, in particular also sensor structures, to be electrically characterized, no measuring pads being present on the MEMS substrate. The approach lies in contacting measuring pads on a second substrate that is connected to the first substrate with the aid of a bonding process.

One advantageous example embodiment of the present invention relates to a micromechanical device, in particular a wafer stack or a portion of a wafer stack, that includes a MEMS substrate and a cap substrate that enclose a plurality of first cavities, with at least one contact pad that is situated in the second cavity, MEMS structures being situated in each case in the first cavities, a MEMS structure in a first cavity, selected from the plurality of first cavities, being connected to the contact pad in the second cavity with the aid of a strip conductor.

One advantageous example embodiment of the present invention relates to a micromechanical device, in particular a wafer stack or a portion of a wafer stack, that includes a MEMS substrate and a cap substrate that enclose a plurality of first cavities, with a plurality of contact pads that are situated in the second cavity, MEMS structures being situated in the first cavities and connected to the contact pads in the second cavity with the aid of strip conductors.

DETAILED DESCRIPTION OF EXAMPLE EMBODIMENTS

Figure 1:
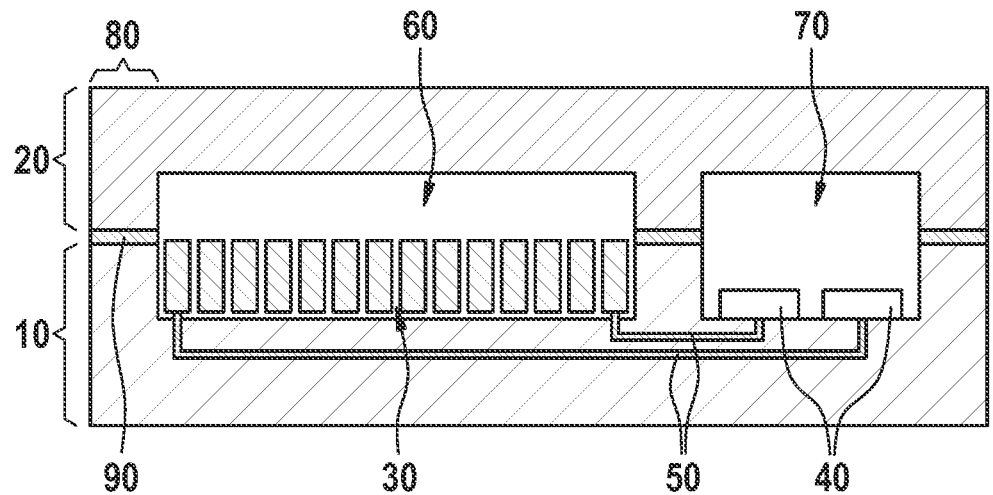
FIG. 1 schematically shows a micromechanical device with contact pads, in the related art.

FIG. 1 schematically shows a micromechanical device with contact pads in the related art. The sectional illustration shows a MEMS substrate 10 and a cap substrate 20 that are connected to one another at bonding frames 80 with the aid of a bond connection 90. The two substrates enclose a first cavity 60 and a second cavity 70. A MEMS structure 30 is situated in the first cavity at an inner surface of the MEMS substrate. Contact pads 40, so-called measuring pads, are situated in the second cavity at the inner surface of the MEMS substrate. The contact pads are connected to portions of the MEMS structure with the aid of electrical strip conductors 50 that extend in or on the MEMS substrate. The micromechanical device is typically manufactured on the wafer level by bonding a cap wafer onto a MEMS wafer.

Figure 2:
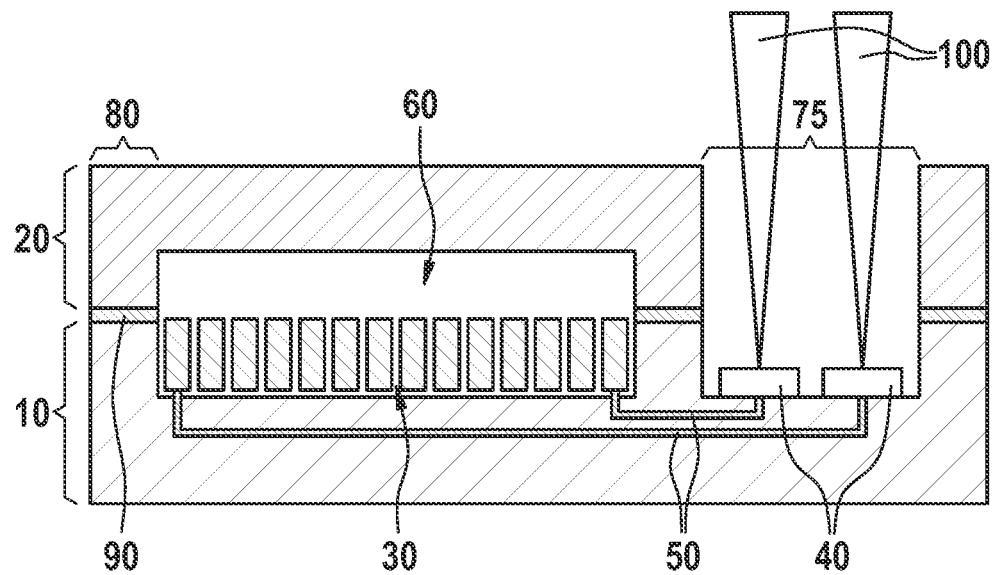
FIG. 2 schematically shows a micromechanical device with exposed contact pads, in the related art.

FIG. 2 schematically shows a micromechanical device with exposed contact pads in the related art. After the wafer bonding, a pad access 75 in the cap substrate is opened, for example by trench etching. Contact pads 40 are thus made accessible, and may be used as measuring pads. The measuring pads may be electrically contacted with measuring needles 100 in order to test MEMS structure 30.

In addition, the contact pads are utilized as bond pads in a subsequent packaging process in order to electrically connect the MEMS structure to an evaluation circuit, for example an ASIC, with the aid of wire bonds.

However, it is impossible or disproportionately complicated to implement the above-described design of the micromechanical device in the related art when the cap substrate includes an integrated circuit (IC, ASIC). In this case, it would not be possible to provide contact pads made of metal (Al, for example) on the MEMS substrate, or this would require an undue level of effort.

In addition, when an ASIC is used as a cap substrate, it is not possible or requires a very high level of effort to achieve access to the measuring cavity via the ASIC. This is due to the complex layered stack that must be opened, and that is made up of numerous different layers (Si substrate, different dielectrics such as SiO2, SiN, SiON, etc., and metal layers).

The individual layers themselves may also include structures. In contrast, in the related art a silicon substrate that is easily opened via a trench is usually used as a cap substrate, since it is made of only one material (Si).

Figure 3A:
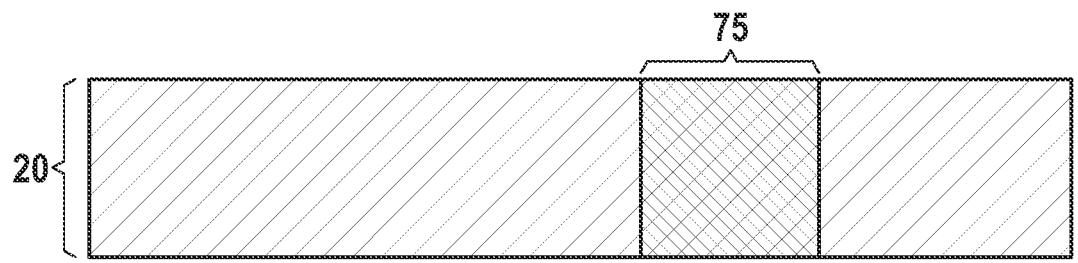
FIGS. 3A and 3B schematically show the layered structure of a cap made of silicon, and an ASIC cap, in a sectional illustration.
Figure 3B:
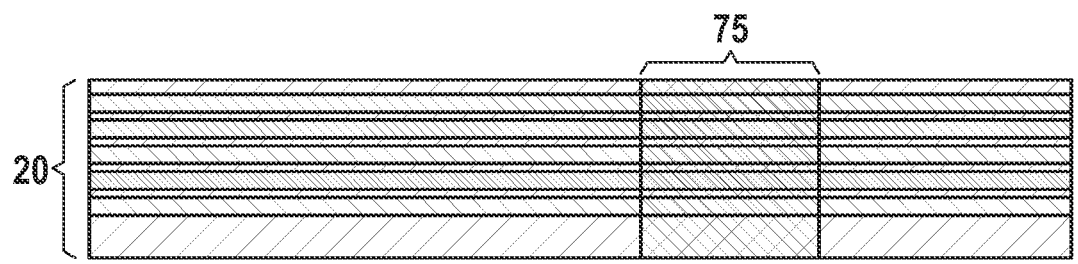

FIGS. 3A and 3B schematically show the layered structure of a cap made of silicon, and an ASIC cap, in a sectional illustration. FIG. 3A shows a cap made of silicon. An access 75 may be easily applied by anisotropic etching in the homogeneous cap material. FIG. 3B shows a cap made up of an ASIC with multiple layers made of various materials. An access 75 would extend vertically through these different layers, and therefore would not be easy to create using a single etching process.

Figure 4:
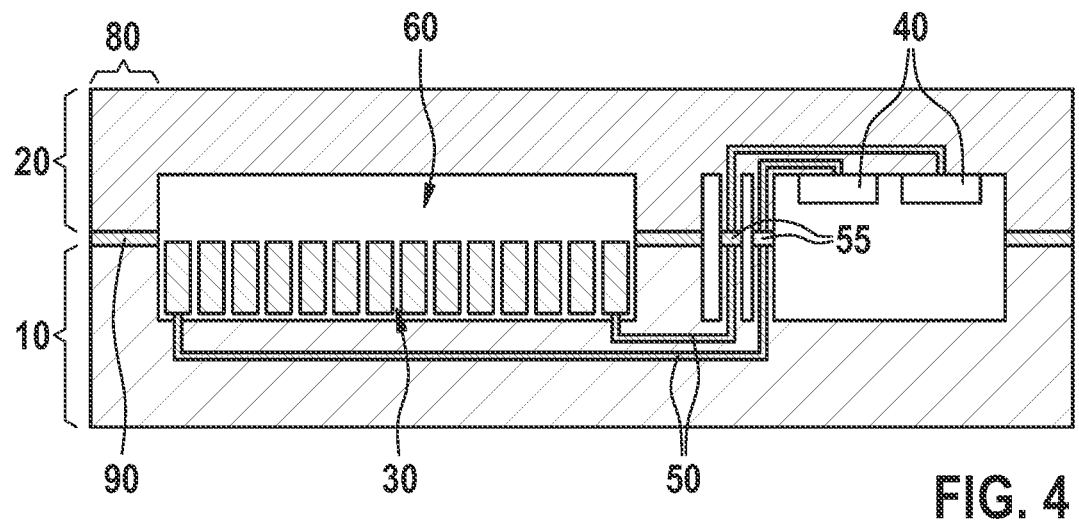
FIG. 4 schematically shows a micromechanical device according to the present invention with contact pads in one exemplary embodiment.

FIG. 4 schematically shows a micromechanical device according to the present invention with contact pads in one exemplary embodiment. In contrast to the related art as described with reference to FIG. 1, contact pads 40 in second cavity 70 are situated at the inner surface of cap substrate 20. This requires an electrical connection between the cap substrate and the MEMS substrate. For this purpose, strip conductors 50 have an electrically conductive connection 55. One implementation option is to electrically connect the substrates to one another at suitable locations via a eutectic Al/Ge connection. This connection may be situated within either the first cavity or the second cavity. In a particularly space-saving arrangement, the contact may be situated in the second cavity. For the arrangement of the contact in the first cavity, a particularly well-protected contact region may be created.

Figure 5:
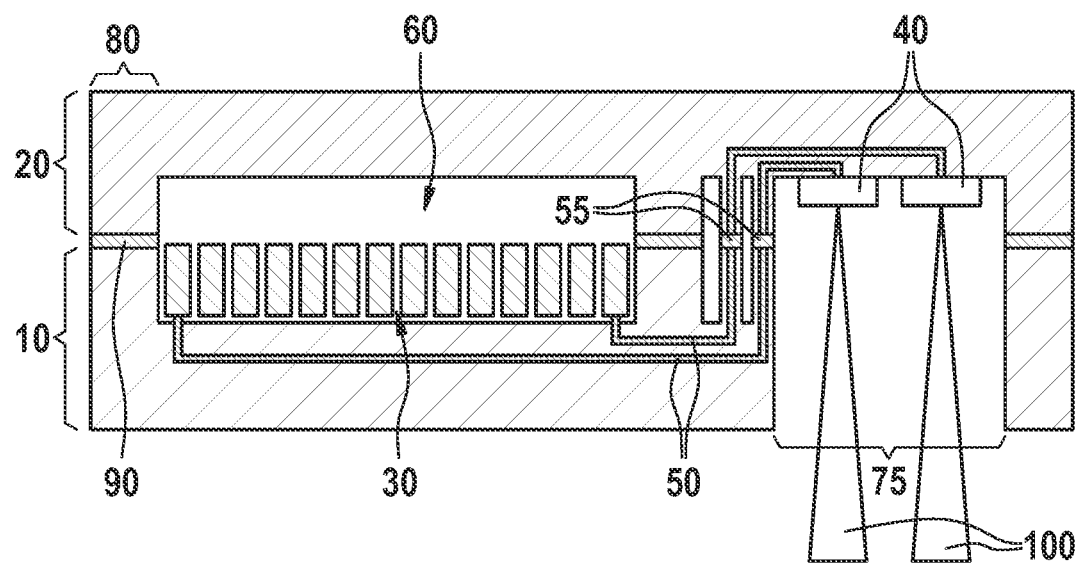
FIG. 5 schematically shows a micromechanical device according to the present invention with exposed contact pads according to the exemplary embodiment.

FIG. 5 schematically shows a micromechanical device according to the present invention with exposed contact pads according to the exemplary embodiment. The micromechanical device from FIG. 4 is illustrated after opening pad access 75 through MEMS substrate 10. The MEMS substrate may be suitably prepared in the area of the pad access by removing at these locations, early in the manufacturing process, layers that are not made of silicon. This requires no additional effort, since structuring of these layers in the region of the sensor element must take place anyway. The measuring needles 100 may be introduced and the measuring pads 40 may be contacted through the pad access.

The explanations up to this point assume that both the sensor element as well as the region of the measuring pads are implemented on one chip. This is the case in the related art, since the measuring pads are subsequently used as bond pads for wire bonds during the packaging process.

Figure 6:
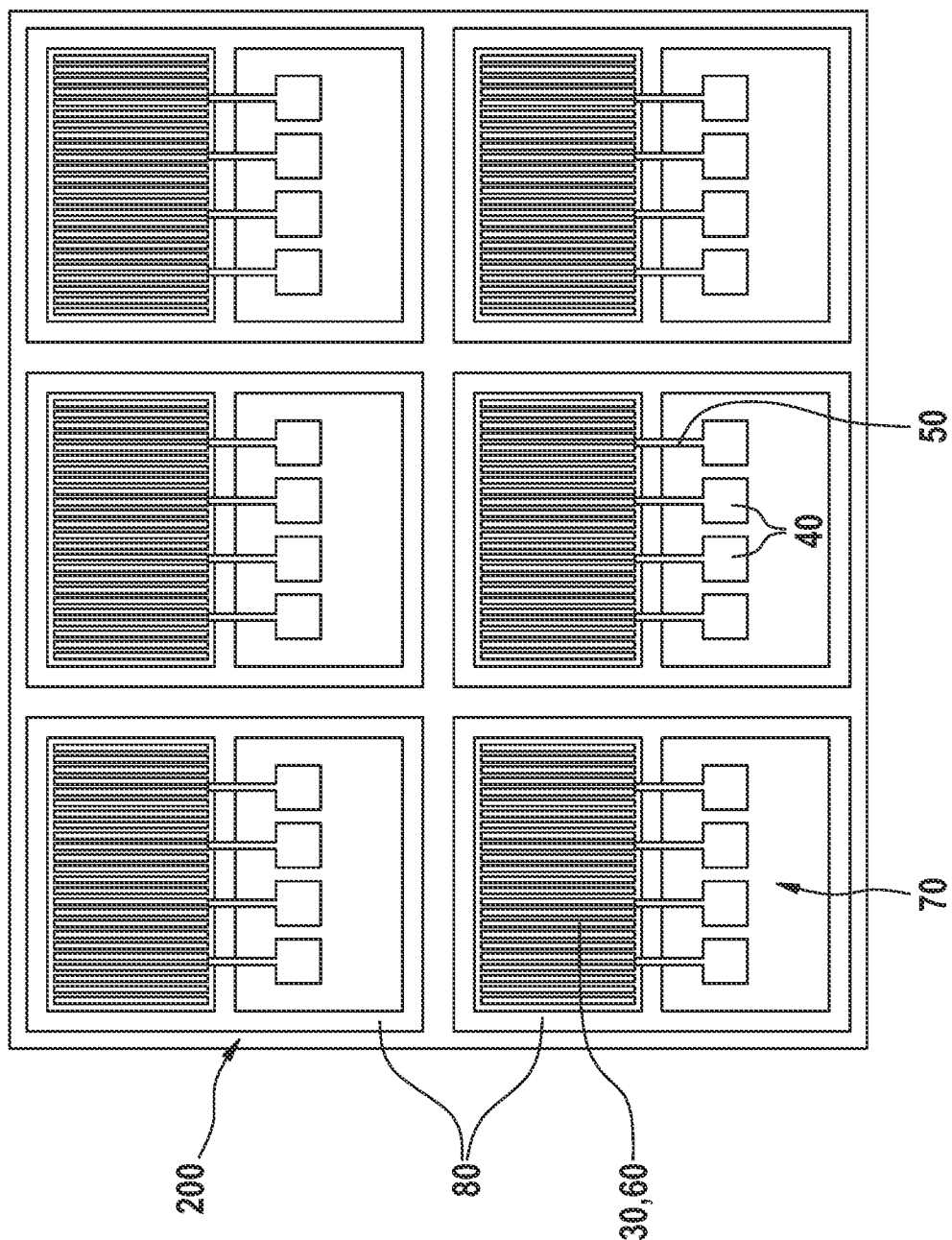
FIG. 6 schematically shows a wafer stack with an arrangement of micromechanical devices with contact pads, in the related art.

Therefore, in the manufacture of the micromechanical devices on the wafer level, for each first cavity containing the MEMS structure, an adjoining second cavity is also provided with the associated electrically connected contact pads. FIG. 6 schematically shows a wafer stack with an arrangement of micromechanical devices with contact pads in the related art. The illustration is rendered in a phantom view in sections, and shows a number of micromechanical devices, each including a first cavity 60 that contains a MEMS structure 30, a second cavity 70 that contains contact pads 40, and strip conductors 50 that electroconductively connect the contact pads to the MEMS structure. A bonding frame 80 is situated around each cavity. Sawing lines 200 are provided between the individual micromechanical devices (the chips).

However, in contrast to MEMS components with a separate ASIC and a simple cap, a design of a micromechanical device with an ASIC as a cap may completely dispense with wire bonds. Instead, the necessary electrical connections between the MEMS substrate and the cap substrate with ASIC may be established directly at the bond seam. Thus, it is also no longer necessary for the sensor element and the associated measuring pads to be situated on the same chip. The important advantage is that the chip size may thus be significantly reduced and therefore production costs may be lowered, since the measuring pads on the chip with the sensor element may be dispensed with. The connection between the measuring pads and the sensor element takes place via electrical strip conductors that may be implemented beyond chip boundaries.

Figure 7:
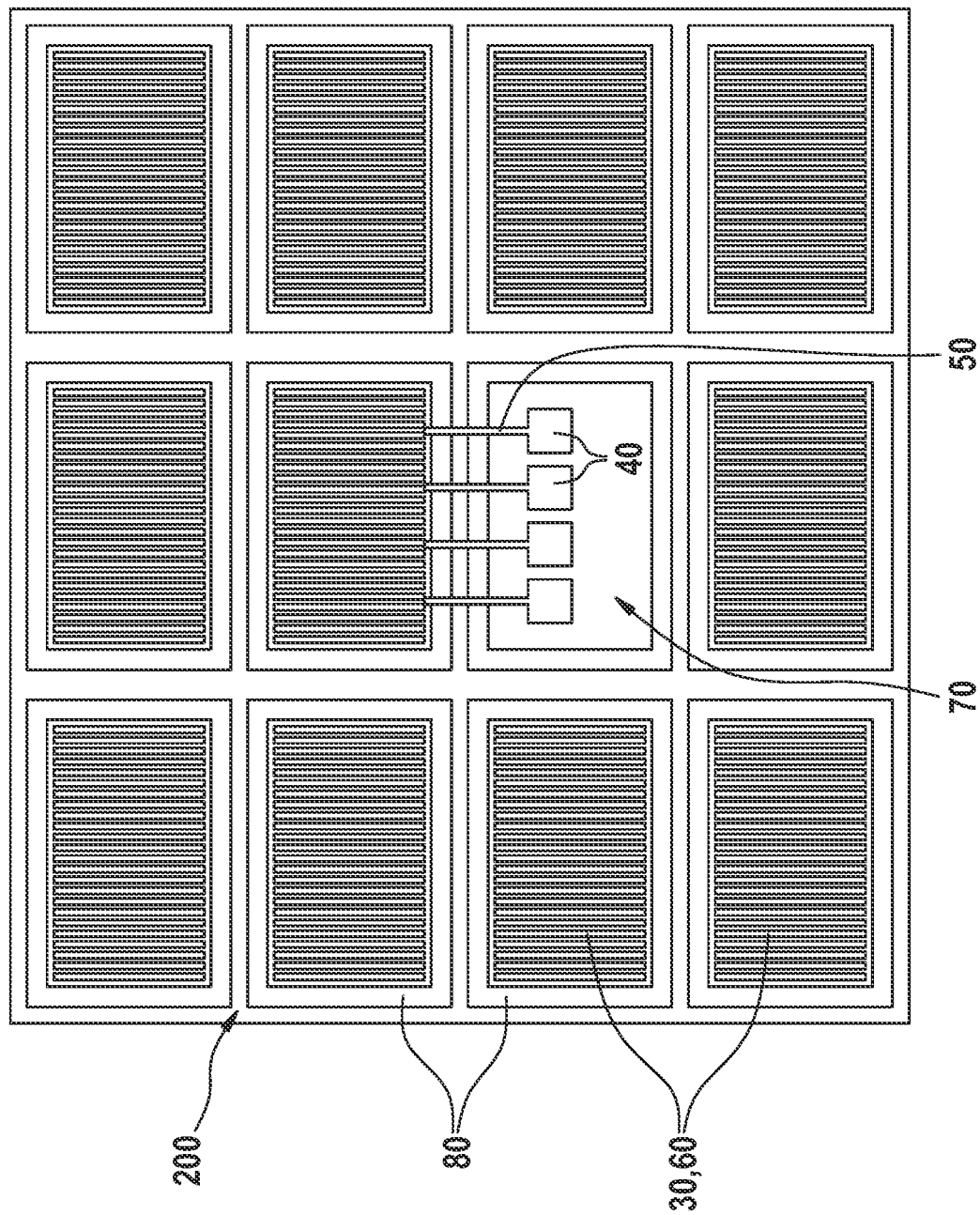
FIG. 7 schematically shows a micromechanical device according to an example embodiment of the present invention in the form of a wafer stack with a plurality of chips including MEMS structures, and with a chip including contact pads.

FIG. 7 schematically shows a micromechanical device according to the present invention in the form of a wafer stack with a plurality of chips including MEMS structures, and with a chip including contact pads. Illustrated in a phantom view in sections are a portion of a wafer stack including a MEMS substrate and a cap substrate that enclose a plurality of first cavities 60, with contact pads 40 that are situated in a second cavity 70, MEMS structures 30 being situated in each case in the first cavities. The MEMS structures of a selected first cavity are connected to the contact pads in the second cavity with the aid of strip conductors 50. All cavities are enclosed by their own bonding frame 80. In addition, sawing lines 200 extend between all cavities, so that after the chips are separated by sawing, MEMS chips without contact pads are produced. The chip with the contact pads may be sorted out.

In particular, the number of useful chips on the wafer may be increased when measuring pads are required only for random sample inspection, and therefore a chip with measuring pads is not necessary for each sensor chip. This is frequently the case with consumer applications. The important feature is that the electrical connection between the measuring pads and the sensor element is established beyond chip boundaries, i.e., also in particular over/under a sawing line. This differs from the related art.

For automotive applications or applications in which a particularly large measuring depth is necessary, it is meaningful to test each MEMS chip. With the novel arrangement, it is possible to carry out a measurement of the MEMS signal for each chip and still save space. Thus, the signals from multiple chips may be conducted into a separate chip, where via the contacts multiple chips are tested at once. Since these contacts are present only for testing and do not have to be subsequently provided with bonding wires, the contacts of a very large number of chips may be combined in a separated chip.

Figure 8:
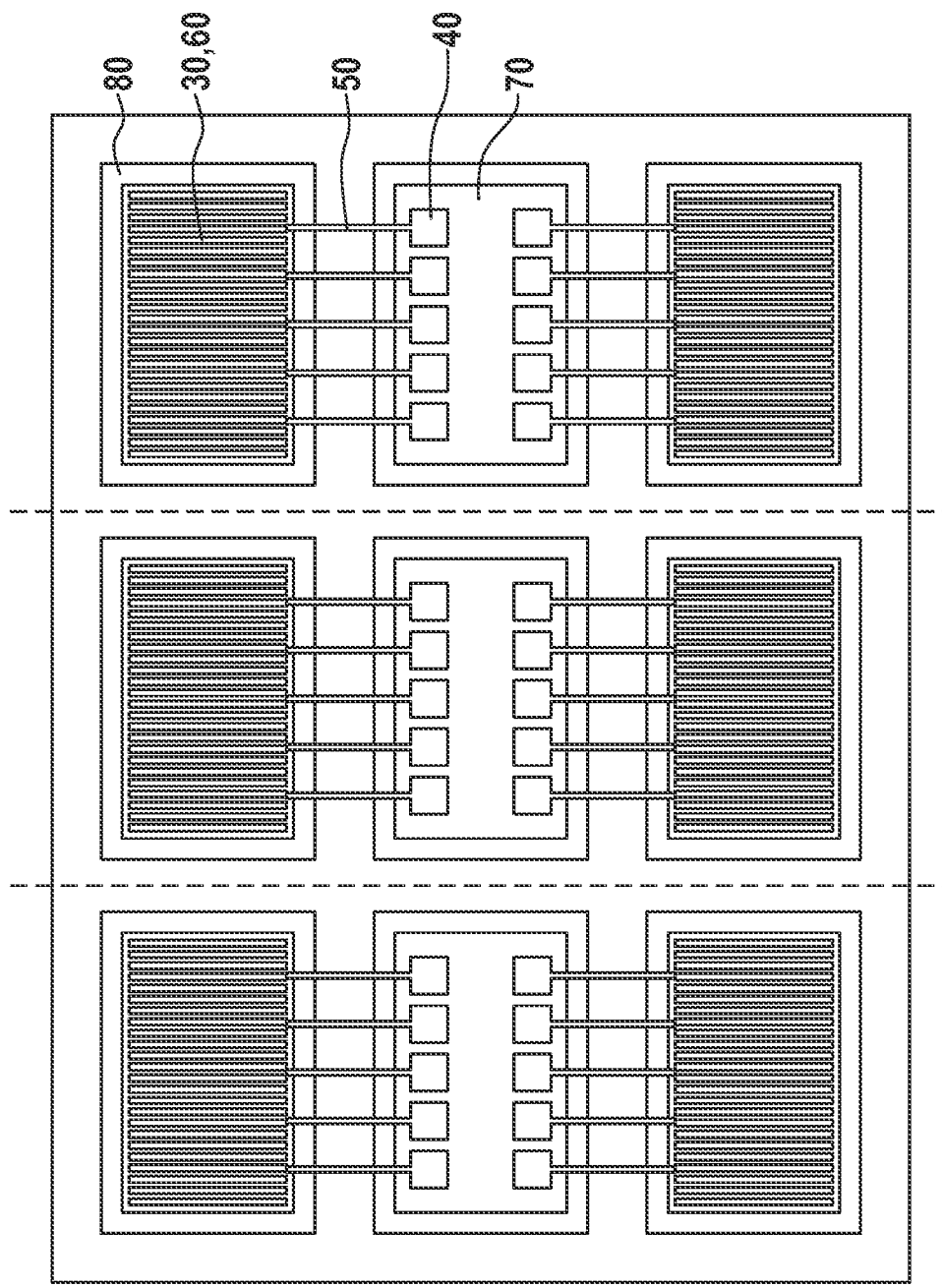
FIG. 8 schematically shows a micromechanical device according to an example embodiment of the present invention in the form of a wafer stack with a plurality of chips including MEMS structures, and with multiple chips including contact pads.

FIG. 8 schematically shows a micromechanical device according to the present invention in the form of a wafer stack with a plurality of chips including MEMS structures, and with multiple chips including contact pads. Illustrated in a phantom view in sections are three contiguous portions of a wafer stack, in which two MEMS chips in each case are associated with a chip that includes contact pads. The three portions are marked by dashed lines. Each portion of the wafer stack includes a plurality of first cavities 60 (two in the present case), each of which contains MEMS structures 30. Associated with same is a second cavity 70, including a plurality of contact pads 40 that are situated in the second cavity. The MEMS structures in all first cavities are connected to the contact pads in the second cavity with the aid of strip conductors 50. All cavities are enclosed by their own bonding frames 80. Sawing lines 200 likewise extend between all cavities, so that after the testing and subsequent separation of the chips by sawing, MEMS chips without contact pads are produced, which are all tested. The chip including the contact pads may once again be sorted out. This applies for any such portion of the wafer stack.

Figure 9:
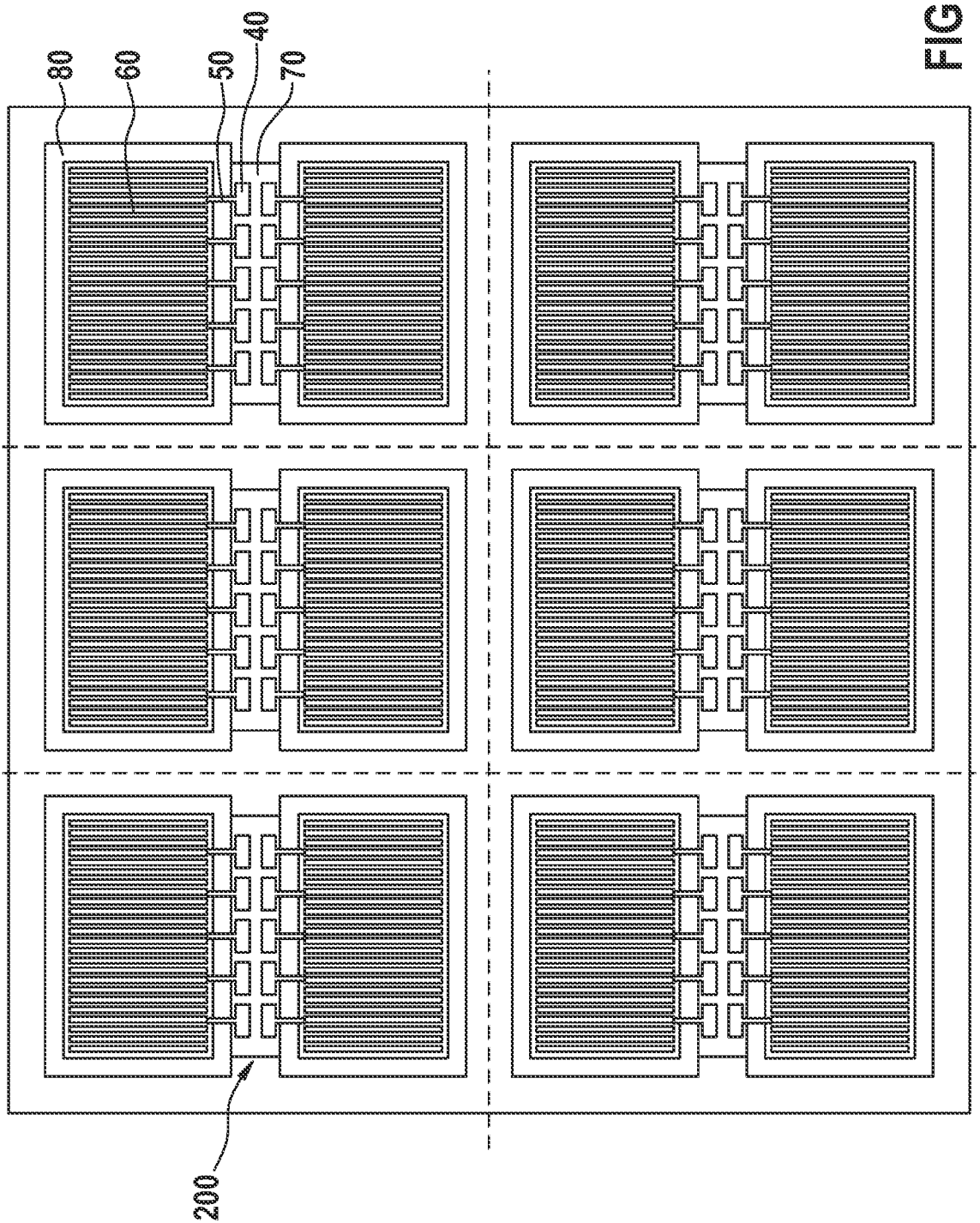
FIG. 9 schematically shows a micromechanical device according to an example embodiment of the present invention in the form of a wafer stack with a plurality of chips including MEMS structures and with contact pads in the sawing line.

In one particularly advantageous arrangement, the measuring pads may also be situated in the sawing line so that the additional space requirements for the measuring pads are reduced as low as possible. FIG. 9 schematically shows such a micromechanical device according to the present invention in the form of a wafer stack with a plurality of chips including MEMS structures, and with contact pads in the sawing line. In contrast to the illustration in FIG. 8, six contiguous portions of a wafer stack are illustrated in a phantom view in sections, in which two MEMS chips 60, 30 in each case are associated with a region including contact pads 40. This region has a narrow design, is situated between the two MEMS chips in sawing line 200, and is not equipped with its own bonding frame.

LIST OF REFERENCE NUMERALS

10 MEMS substrate
20 cap substrate
30 MEMS structure
40 contact pad
50 strip conductor
55 electrical connection between the MEMS substrate and the cap substrate
60 first cavity
70 second cavity
80 bonding frame
90 bond connection
75 pad access
100 measuring needles
200 sawing line

What is claimed is:

1. A micromechanical device, comprising:
   a MEMS substrate and a cap substrate that enclose at least one first cavity;
   at least one contact pad situated outside the first cavity; and
   a MEMS structure situated in the first cavity and connected to the contact pad using a strip conductor, the strip conductor extending at least partially in the MEMS substrate;
   wherein the contact pad is situated in a second cavity formed by the MEMS substrate and by the cap substrate,
   wherein the contact pad is situated at an inner surface of the cap substrate and adjoining an upper surface of the second cavity.

2. The micromechanical device as recited in claim 1, wherein the second cavity has a pad access to an outside via the MEMS substrate.

3. The micromechanical device as recited in claim 2, wherein the strip conductor includes an electrically conductive connection between the MEMS substrate and the cap substrate.

4. The micromechanical device as recited in claim 1, wherein the cap substrate includes an integrated electronic circuit.

5. The micromechanical device as recited in claim 4, wherein the integrated electronic circuit is an application specific integrated circuit (ASIC).

6. The micromechanical device as recited in claim 1, further comprising:
   a wafer stack or a portion of a wafer stack, that includes:
   the MEMS substrate and the cap substrate, the MEMS substrate and the cap substrate enclosing a plurality of first cavities;

the at least one contact pad that is situated in the second cavity; and

MEMS structures situated in respective ones of the first cavities, one of the MEMS structures in a first cavity selected from the plurality of first cavities, being connected to the contact pad in the second cavity using the strip conductor.

7. The micromechanical device as recited in claim 1, further comprising:

a wafer stack or a portion of a wafer stack, that includes:
the MEMS substrate and the cap substrate, the MEMS substrate and the cap substrate enclosing a plurality of first cavities,
a plurality of contact pads situated in the second cavity, and
MEMS structures situated in the first cavities and connected to the contact pads in the second cavity using strip conductors.

* * * * *